United States Patent [19]
Rooke

[11] Patent Number: 4,934,884
[45] Date of Patent: Jun. 19, 1990

[54] CONNECTOR ELEMENT

[75] Inventor: Michael P. Rooke, Sunbury-on-Thames, Great Britain

[73] Assignee: Barry Controls Ltd., Surry, England

[21] Appl. No.: 232,360

[22] Filed: Aug. 15, 1988

[30] Foreign Application Priority Data

Aug. 18, 1987 [GB] United Kingdom ............... 8719484

[51] Int. Cl.⁵ ............................................. F16B 31/12
[52] U.S. Cl. ........................................ 411/8; 411/14; 411/378; 411/383; 411/916
[58] Field of Search ............... 411/1, 7, 8, 9, 10, 411/11, 14, 103, 107, 114, 134, 166, 105, 347, 337, 378, 383, 384, 500, 548, 911, 916, 4 R

[56] References Cited

U.S. PATENT DOCUMENTS

| | | | |
|---|---|---|---|
| 3,273,443 | 9/1966 | Rubin | 411/7 |
| 3,294,140 | 12/1966 | Cosenza | 411/105 |
| 3,368,602 | 2/1968 | Boyd | 411/105 |
| 3,383,973 | 5/1968 | Gazal | 411/1 |
| 3,555,491 | 1/1971 | Moss | 411/7 X |
| 3,683,988 | 8/1972 | Carter et al. | 411/105 |
| 4,692,075 | 9/1987 | Metz | 411/7 |
| 4,720,223 | 1/1988 | Neights et al. | 411/11 |

FOREIGN PATENT DOCUMENTS

| | | |
|---|---|---|
| 71559 | 2/1983 | European Pat. Off. . |
| 105609 | 4/1984 | European Pat. Off. . |
| 828194 | 2/1960 | United Kingdom ............... 411/105 |

*Primary Examiner*—Rodney M. Lindsey

[57] ABSTRACT

A connector element is described which is suitable for connecting together two components (2a, 2b) in a system which is likely to be subject to vibration. The connector element has an indicating mechanism which provides an easily visible effect to show whether or not the two components are mated. In one embodiment the edges (10a) of a spring (10) protrude from a recessed portion (18a) in a nut (18) at the end of the bolt to indicate the unmated condition. In another form the end of an indicating lever (110) protrudes from a slot (112) in an adjusting nut (180).

7 Claims, 5 Drawing Sheets

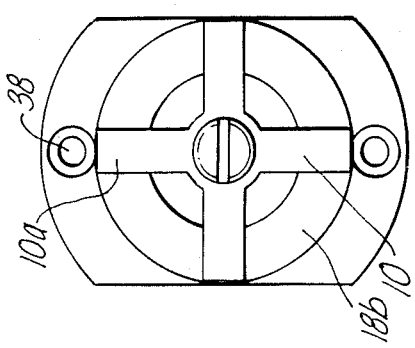
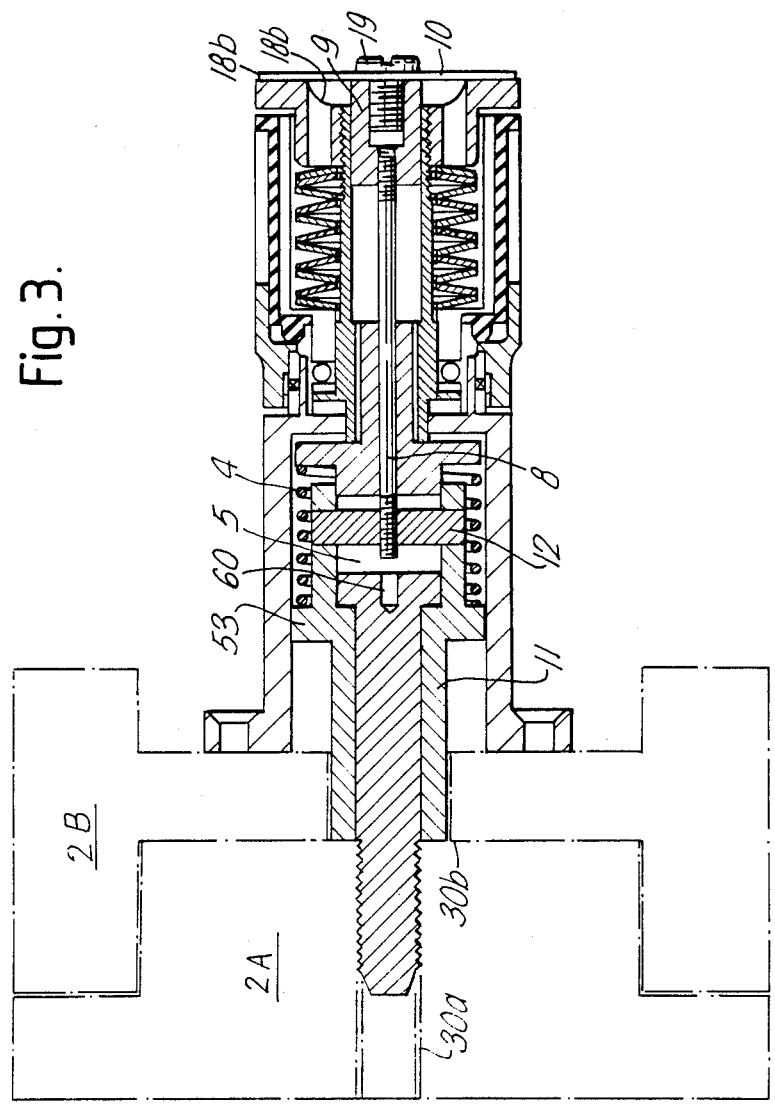

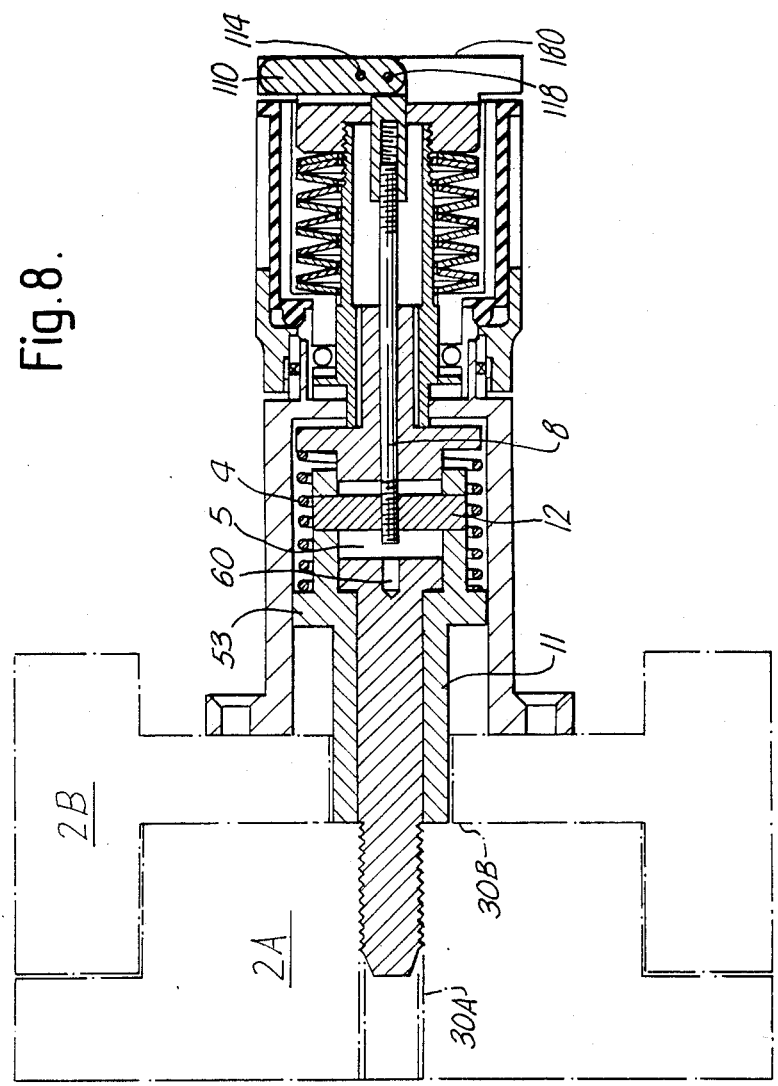

CONNECTOR ELEMENT

BACKGROUND OF THE INVENTION

This invention relates to a connector element.

SUMMARY OF THE INVENTION

The connector element described herein has particular application for connecting two components in a system which is likely to be subject to vibration.

According to the present invention there is provided a connector element for use in connecting together two components, the components having respective surfaces, which, when the components are connected together, abut one another, the connector element comprising:

(i) a shaft having a threaded end region and, remote from said end region, a radial flange, the shaft further having a passageway extending axially for at least part of its axial length;

(ii) a sleeve coaxial with and positioned around the shaft, the sleeve having an end surface proximate the threaded end region of the shaft and a radial flange remote from said end surface;

(iii) biasing means arranged between the radial flange of the shaft and the radial flange of the sleeve to urge the sleeve axially along the shaft in a direction away from the radial flange on the shaft;

(iv) an elongate member disposed for movement along the passageway in the shaft and coupled to the sleeve so as to undergo such movement in dependence upon axial movement of the sleeve, the elongate member having a region extending out of the shaft at the end thereof remote from the threaded end region of the shaft; and (v) indicating means coupled to said region of the elongate member and responsive to movement thereof to indicate whether the shaft and the sleeve are in predetermined relative positions.

In one application such predetermined relative positions can be indicative that two components just abut.

The connector element can include a rotatable grip remote from said threaded end region of the shaft and coupled to the shaft so that rotation of said grip causes rotation of said shaft, said end region of the elongate member extending axially of the grip.

In the first embodiment, the grip includes means providing a surface having a recessed portion, for example of dished shape, and the indicating means comprises a resilient planar indicating element secured to said end region of the elongate member.

In a second embodiment, the grip includes means providing a surface having a slot, and the indication means comprises a further elongate member (indicator lever) pivotally mounted to said end region of the first-mentioned elongate member.

In both embodiments, the arrangement is such that the connector element operates as follows:

when the connector element is not in use the sleeve is urged by the biasing means in the direction away from the radial flange on the shaft, thereby causing the elongate member to adopt a first position in which part of the indicating element protrudes above the surface of the grip to indicate that the components are not correctly relatively positioned. In the first embodiment, the resilient planar indicating element sits in the recessed portion of the grip, whereby the shape of the indicator element is deformed so that its edges protrude above the grip surface. In the second embodiment, the indicator lever is pivoted so that its end protrudes from the slot. When the connector element is in use to connect together two such components, the indicating element will remain in that first position until the predetermined relative positions of the sleeve and shaft have been reached, when the sleeve causes the indicating element to move against the action of the biasing means towards the radial flange of the shaft thereby urging the elongate member towards the second position in which the indicating element lies flush against the grip surface, thereby indicating that the components are correctly relatively positioned. In the first embodiment the resilient planar indicating element is released from the recessed portion so that it lies flush against the grip surface. In the second embodiment the indicator lever lies within the slot.

Preferably the shaft is formed with a slot in which slides a bar which is secured to the sleeve to extend diametrically thereof and which is fixedly secured to the first-mentioned elongate member.

In the preferred embodiment the grip incorporates a torque limiting device for limiting the torque applied to the shaft after two components have been correctly relatively positioned, as indicated by the indicating means.

Since the connector element of the preferred embodiment of the present invention incorporates a torque limiting device, it will be referred to hereinafter as torque limited bolt.

The connector element described hereinafter can ensure that two components just abut when the connector element is done up and is resistant to vibration so that it will not inadvertently come undone while in use. Preferably, the connector element should be able to be positively locked against undoing itself under the influence of vibration. In addition, the connector element should preferably not exert a force greater than is required just to ensure that the components abut.

BRIEF DESCRIPTION OF THE DRAWINGS

For a better understanding of the present invention and to show how the same may be carried into effect, reference will now be made, by way of example, to the accompanying drawings, in which:

FIG. 3 is an axial section of the bolt of FIG. 1 in use;

FIG. 4 is an end view of the bolt of FIG. 3;

FIGS. 6 to 10 are views, corresponding to those of FIGS. 1 to 5, of another embodiment of the bolt; and

DESCRIPTION OF THE PREFERRED EMBODIMENTS

Figure 2:
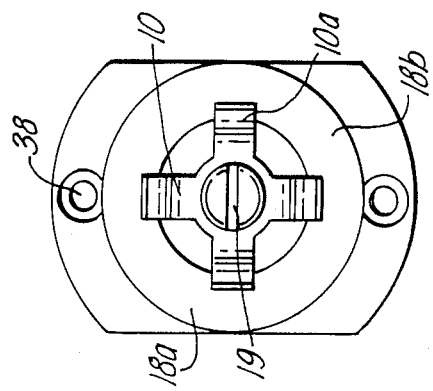
FIG. 2 is a view from the end of FIG. 1.
Figure 1:
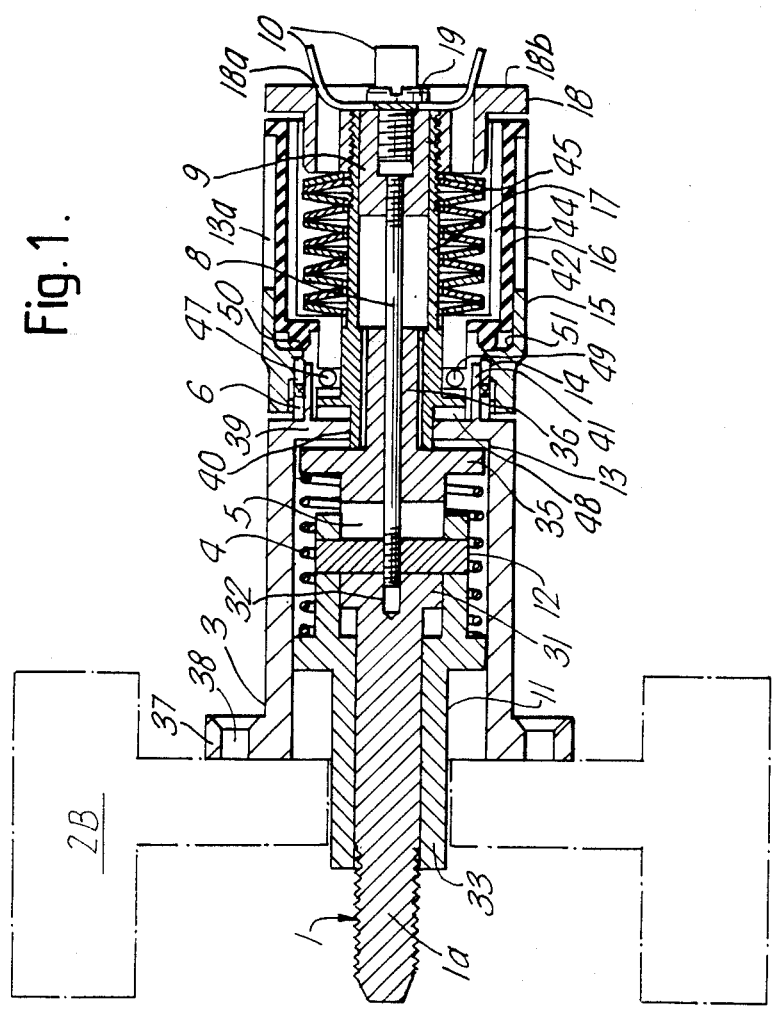
FIG. 1 is an axial section through one embodiment of a bolt ready for use.

Reference is made to FIGS. 1 to 4. It is noted that reference numerals present in FIGS. 1 and 2 are not generally duplicated in FIGS. 3 and 4. This is for reasons of clarity. The purpose of the bolt is to ensure that two mating components 2A and 2B are fixedly relatively secured in a vibration proof manner. For this purpose, the bolt is permanently in place relative to the mating component 2B shown in FIG. 2, and when component 2A is brought into contact with the component 2B the bolt is done up until the components just mate, whereafter a predetermined torque is applied to maintain a secure connection.

The bolt comprises a shaft 1 screw threaded at one end 1a to engage a correspondingly screw threaded hole 30a in component 2A of the two mating components 2A, 2B. The shaft is disposed in collar 33 and is formed with a portion 31 of larger diameter than that of the end 1a, this portion 31 of larger diameter having a slot 5 formed therein. The shaft 1 also has a radial flange 35 and on one side of this flange 35 (to the right in FIG. 1) a smaller diameter portion 36 extending within a sleeve 17. The smaller diameter portion 36 is fixedly secured to the sleeve 17 to rotate therewith. It is possible however to replace one shaft by another to accommodate different sized shafts. The shaft 1 has a passageway 32 formed therein for receiving a rod 8 of an indicating mechanism to be described in more detail hereinafter.

A cylindrical casing 3 has a flange 37 to be secured to the component 2B by means of holes 38 in combination with screws or other suitable securing elements. As an alternative, the casing 3 can be formed as part of the component 2B. In any event, the casing 3 enables the bolt to be left permanently in place relative to component 2B, the shaft 1 passing through a hole 30B in the component 2B aligned with the threaded hole 30A. The casing 3 has a front wall 39 provided with an aperture 40 for receiving the sleeve 17. A thrust washer 13 for extraction is provided between the flange 35 of the shaft and the front wall 39 of the casing 3.

The casing 3 also carries an axially extending cylindrical portion 41, having serrated teeth 6 the purpose of which is described in more detail hereinafter.

A rotatable grip 42 is fitted about the sleeve 17, the grip 42 comprising an external collar 15 and a knob 44. The knob 44 carries a colour coded elastomeric cylinder 16 externally visible through area 13a. The colour coding is indicative of the maximum torque which can be applied by the bolt. The collar 15 can slide but not rotate relative to the knob 44. The elastomeric cylinder 16 has four circumferentially spaced protrusions 50 which provide a biasing force against a recessed surface 51 of the collar 15. This assists in preventing vibrational effects from undoing the bolt once secured.

The knob 44 has, at its right hand end as seen in FIG. 1, a recess in which are disposed a pack of disc springs, (for example Belleville washers) 45. The springs are held in position by an adjustable nut 18. The adjustable nut 18 has in its surface 18b a recessed or dished portion 18a the purpose of which will be described hereinafter.

The axially extending portion 41 of the casing 3 forms an annular recess which co-operates with the collar 15 of rotatable grip 42 and the sleeve 17 to define an annular cavity housing a torque limiting arrangement 47. The torque limiting arrangement is as described in European Patent Application No. 83305061.0 (Publication No. 0105609) and comprises a drive plate 48 and a plurality of ball bearings 49. Operation of the arrangement is described in detail in EPA No. 0105609 and will hence not be described in more detail hereinafter.

Figure 5:
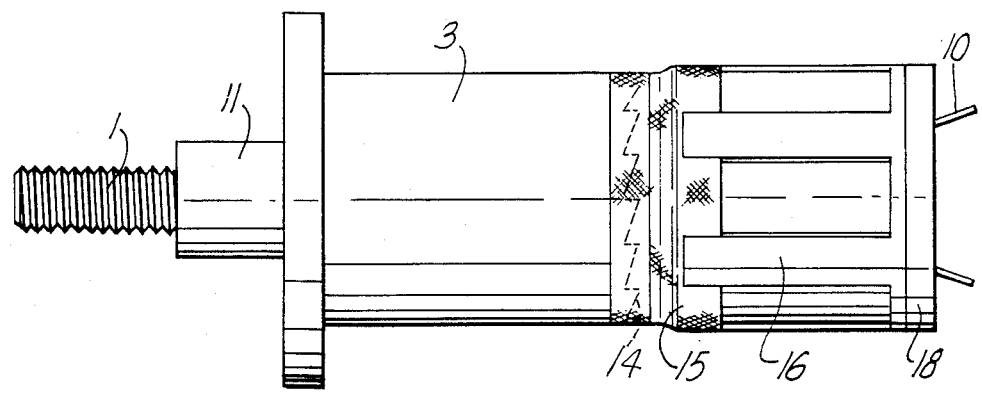
FIG. 5 is a side elevation of the bolt.
Figure 10:
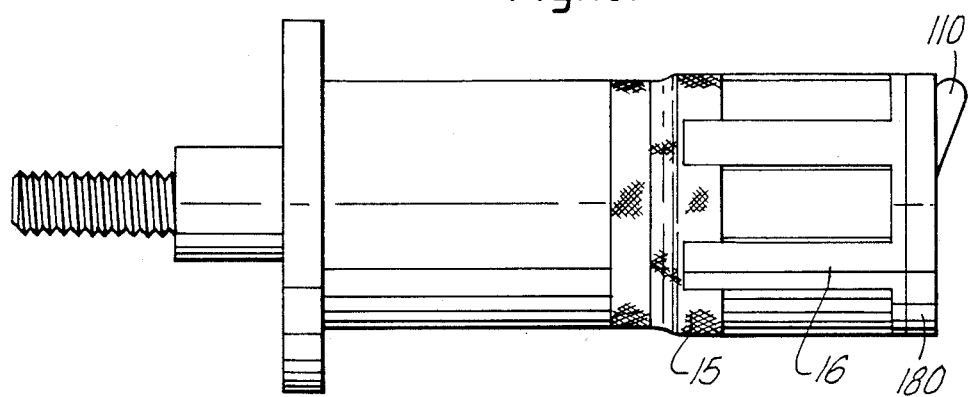
Figure 7:
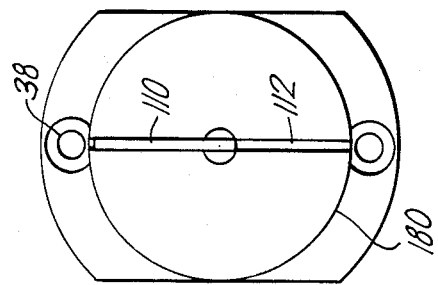
Figure 6:
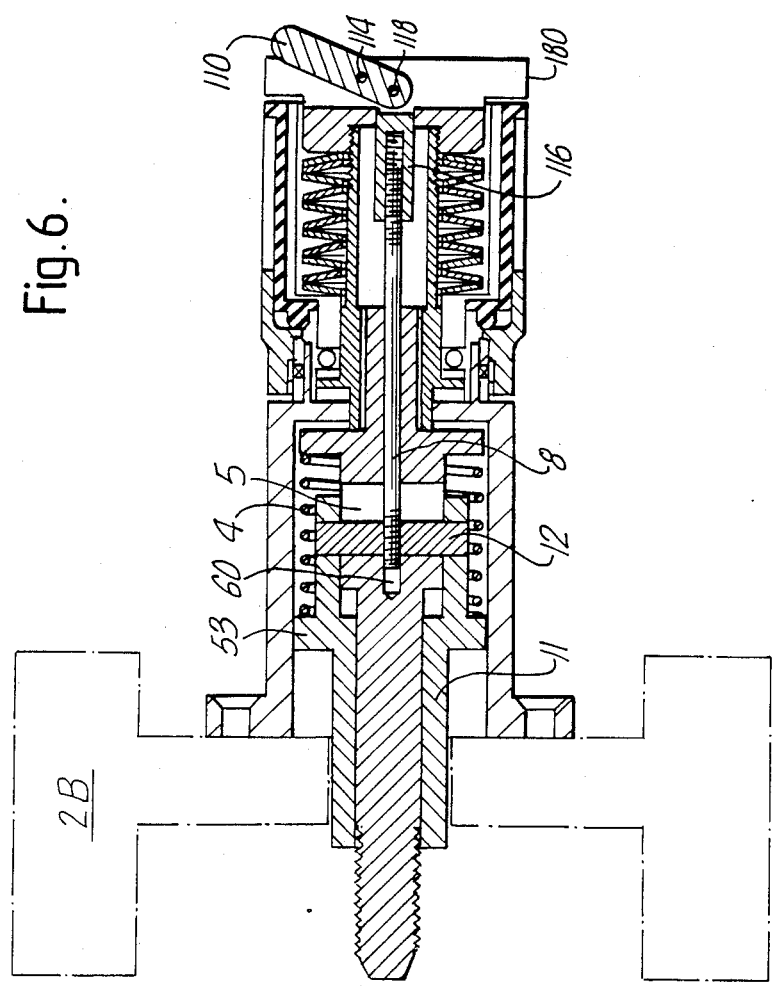

The collar 15 is removably secured to the axially extending portion 41 of the casing 3 via a positive self locking rachet mechanism. The rachet mechanism comprises the set of "saw teeth" 6 on the axially extending portion 41 co-operating with a set of similar teeth 14 on the collar 15. The saw teeth are so shaped (see FIG. 5) that the leading edge has a smaller gradient than the trailing edge whereby rotation of the collar 15 of the grip 42 in one direction is permitted (the direction which cause the bolt to be tightened), against resistance caused by the action of the trailing surface of a tooth on the collar 15 sliding "up and over" the leading surface of a tooth on the axially extending portion 41. Rotation in the opposite direction is prevented unless the collar 15 is pulled axially away, against the action of the protrusion 50 of the elastomeric cylinder 16, from the axially extending portion 41 to release the teeth. Once done up, there is hence no danger of the bolt coming undone.

The indicating mechanism will now be described in detail. Reference numerals for components of the mechanism are shown only in FIG. 2 for the sake of clarity. The mechanism includes a sleeve or collar 11 encircling the shaft 1 between the latter and the hole 30B and a T-piece 12 located in apertures in the collar 11 and assembled onto one end of the rod 8 so as to be slidable (with axial movement of the rod 8) along the slot 5. The T-piece 12 is secured to the rod 8 by screwing. In this way, the operable length of the rod 8 can be adjusted as decribed later. The collar 11 has a flange 53 between which and the flange 35 of the shaft 1 is arranged a coil spring 4. At the end of the rod 8 remote from said one end is a rod guide 9 which is screw threadedly secured to the rod 8. While it might be simplest to manufacture the push rod 8 with a screw thread along its entire length, a screw thread is only required at the one end where it is connected to the T-piece 12 and at the other end where it is connected to the guide 9. An adjusting screw 19 serves to attach an indicator spring 10 to the guide 9. The indicator spring 10 can take the form of a planar resilient member such as a flat flexible member of cruciform shape (as illustrated) or an elastomeric disc. It will be apparent from the following description that other resilient members could be used, but the aforementioned forms have been found to be preferred. An important point however is that the resilient strength of the indicator spring 10 is less than the resilient strength of the coil spring 4. The adjusting screw 19 can adjust the position of the rod 8 longitudinally relative to the passageway 32. In this way, the bolt can be set up by positioning the collar 11 flush with the face of connector 2B and then adjusting the adjusting screw 19 until the indicator spring 10 lies flat against the facing surface 18b of the nut 18, as shown in FIG. 3. To accommodate this adjustment, a recess 60 is provided in the shaft 1.

Operation of the bolt is as follows. In the unmated condition of the components 2A, 2B, the spring 4 maintains the collar 11 in a position such that it protrudes through one of the mating connectors 2B.

The coil spring 4 overcomes the force exerted by the indicator spring 10 to pull the latter into the dished portion 18a of the adjusting nut 18, forcing the tags 10a of the cruciform spring 10 (or the periphery of an elastomeric disc) to protrude from the nut 18 to indicate the unmated condition of the connector. When the thread of the shaft 1 is engaged in the connector 2A, the knob 44 is rotated to draw the two connectors 2A, 2B together. As the knob 44 rotates it turns the collar 15, the serrated teeth 6 of which are allowed to ride over the serrated teeth 14 of the casing 3 against the pressure exerted by the circumferentially spaced protrusions of the elastomeric cylinder 16. As the connectors 2A, 2B mate, the collar 11 is pushed back against the force of the spring 4 which causes the T-piece 12 and hence the push rod 8 and guide 9 to be moved axially so as to permit the indicator spring 10 to resume its flat condition flush with the surface 18b of the nut 18 as shown in FIG. 3. The knob 44 is further rotated until the torque limit is reached [as described in the above-referenced European patent application] after which the torque limiting mechanism 47 will slip and the shaft 1 will no longer be driven.

Any anti-clockwise rotation of the knob 44 under vibration is prevented by the collar 15 and the co-operation of its serrated teeth 14 with the serrated teeth 6 under the reaction of the elastomeric protrusions 50. In order to undo the bolt and to separate the connectors 2A, 2B, the collar 15 must be pulled back against the force of the elastomeric cylinder 16 on the knob 44 to disengage the rachet of the serrated teeth and the whole knob rotated anti-clockwise. This must be repeated until the connectors are disengaged. However, as soon as the connectors part, the action of spring 4 causes the indicator spring 10 to be pulled back making the tags protrude again.

Reference is now made to the embodiment shown in FIGS. 6 to 10, in which the indicator spring 10 is replaced by an indicator lever 110. As this embodiment operates on the same principal as the embodiment described with reference to FIGS. 1 to 5, only the differences between the two embodiments will be described in the following.

An adjustable nut 180 replaces the adjustable nut 18 of the first described embodiment. The adjustable nut 180 has a slot formed in its surface. Indicator lever 110 is located within the slot 112 by a pivot pin 114. In place of the rod guide 9, a push rod 116 may be connected to the end of the rod 8. The end of the push rod 116 is attached to the indicator lever by means of a further pivot pin 118. The proximity of pivot points 114 and 118 serves to amplify the movement of lever 110 in response to movement of push rod 116. The width of the indicator lever is less than the diameter of the push rod 116 in order that the indicator lever can be held axially with the push rod and both items screwed onto the rod 8. In this way, the bolt can be set up by positioning the collar 11 flush with the face of the connector 2b and screwing the push rod complete with the indicator lever assembled on the pivot pin 118 until the indicator lever can be positioned at 90° relative to the push rod 116, so that it lies flush within the slot adjusting nut 180 as shown in FIG. 8.

Indicating mechanism operates substantially as described above. That is, the coil spring 4 pulls the end of the indicator lever secured to the push rod 116 thereby causing the opposite end region to protrude from the slot in the adjusting nut 180 to indicate the unmated condition of the connector. When mated, the push rod 116 is moved axially to cause the indicator lever 110 to lie flush within the slot in the adjusting nut 180.

A particular feature of the described bolt is that the thrust washer 48 keyed onto the sleeve 17 causes the components of the bolt to the left of the wall 39 to be maintained in tension relative to end wall 39. Vibrational effects on the bolt to the left of end wall 39 are hence reduced.

Another important feature of the bolt is that the indicating mechanism provides an easily visible effect to show whether or not the components are mated. This can be seen most readily from FIG. 1, in which the cruciform tags 10a protrude to indicate the unmated condition. When the connectors are mated, the spring 10 lies flush with the surface 18b.

The same is true of the embodiment of FIGS. 6 to 10 in which the indicator lever end protrudes to indicate the unmated condition, and, when the connectors are mated, lies flush within the slot.

It is apparent that modifications and changes can be made within the spirit and scope of the present invention but it is my intention, however, to be limited only the scope of the appended claims.

As my invention, I claim:

1. A connector element for use in connecting together two components, the components having respective surfaces, which, when the components are connected together, abut one another, the connector element comprising:
    (i) a shaft having a threaded end region and, remote from said end region, a radial flange, the shaft further having a passageway extending axially for at least part of its axial length;
    (ii) a collar coaxial with and positioned around the shaft, the collar having an end surface proximate the threaded end region of the shaft and a radial flange remote from said end surface;
    (iii) biasing means arranged between the radial flange of the shaft and the radial flange of the collar to urge the collar axially along the shaft in a direction away from the radial flange on the shaft;
    (iv) an elongate member disposed for movement along the passageway in the shaft and coupled to the collar so as to undergo such movement in dependence upon axial movement of the collar, the elongate member having a region extending out of the shaft at the end thereof remote from the threaded end region of the shaft; and
    (v) indicating means coupled to said region of the elongate member and responsive to movement thereof to indicate whether the shaft and the collar are in predetermined relative positions.

2. A connector element as claimed in claim 1 which includes a rotatable grip remote from said threaded end region of the shaft and coupled to the shaft so that rotation of said grip causes rotation of said shaft, said end region of the elongate member extending axially of the grip.

3. A connector element as claimed in claim 1 or 2 in which the grip includes means providing a surface having a recessed portion, and the indicating means comprises a resilient planar indicating element secured to said end region of the elongate member.

4. A connector element as claimed in claim 1 or 2 in which the grip includes means providing a surface having a slot, and the indicating means comprises a further elongate member pivotally mounted to said end region of the first-mentioned elongate member.

5. A connector element as claimed in claims 3 or 4 in which the shaft is formed with a slot in which slides a bar secured to the collar to extend diametrically thereof and which is fixedly secured to the first-mentioned elongate member.

6. A connector element as claimed in claim 3 or 4 in which the grip incorporates a torque limiting device for limiting the torque applied to the shaft after two components have been correctly relatively positioned, as indicated by the indicating means.

7. A connector element as claimed in claims 3 or 4 which includes means enabling it to be positively locked when two components have been correctly relatively positioned against wandering under the influence of vibration.

* * * * *